(12) United States Patent
Luo et al.

(10) Patent No.: US 10,881,031 B2
(45) Date of Patent: Dec. 29, 2020

(54) COOLING SYSTEM OF DATA CENTER COMPUTER ROOM AND DATA CENTER

(71) Applicant: BEIJING BAIDU NETCOM SCIENCE AND TECHNOLOGY CO., LTD., Beijing (CN)

(72) Inventors: Zhiming Luo, Beijing (CN); Tianyu Zhou, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 84 days.

(21) Appl. No.: 16/134,039

(22) Filed: Sep. 18, 2018

(65) Prior Publication Data

US 2019/0124798 A1    Apr. 25, 2019

(30) Foreign Application Priority Data

Oct. 25, 2017    (CN) .......................... 2017 1 1007804

(51) Int. Cl.
  *F25D 23/12*    (2006.01)
  *H05K 7/20*    (2006.01)
  *F28C 1/00*    (2006.01)

(52) U.S. Cl.
  CPC .......... *H05K 7/20827* (2013.01); *F28C 1/00* (2013.01); *H05K 7/2079* (2013.01); *F28C 2001/006* (2013.01)

(58) Field of Classification Search
  CPC .... H05K 7/20827; H05K 7/2079; F28C 1/10; F28C 2001/006

USPC ........................................................ 62/259.2
See application file for complete search history.

(56) References Cited

U.S. PATENT DOCUMENTS

| | | | | |
|---|---|---|---|---|
| 5,287,706 | A * | 2/1994 | Williams | F25B 5/02 62/117 |
| 5,963,458 | A * | 10/1999 | Cascia | F25B 49/02 165/200 |
| 2002/0088184 | A1* | 7/2002 | Hiraki | F24F 7/02 52/79.1 |
| 2014/0254085 | A1* | 9/2014 | Slessman | B65D 15/08 361/679.31 |
| 2014/0321050 | A1* | 10/2014 | Sato | G06F 1/20 361/679.47 |
| 2017/0303443 | A1 | 10/2017 | Inano et al. | |

FOREIGN PATENT DOCUMENTS

| CN | 206439960 U | 8/2017 |
|---|---|---|
| CN | 107223009 | 9/2017 |

* cited by examiner

*Primary Examiner* — David D Hwu
(74) *Attorney, Agent, or Firm* — Lathrop GPM LLP

(57) ABSTRACT

A cooling system of a data center computer room and a data center are provided. A specific embodiment of the system comprises: a liquid cooling system, including a liquid cooling cabinet, a heat exchanger forming a first circulation loop with the liquid cooling cabinet, and a cooling tower forming a second circulation loop with the heat exchanger; and a radiant cooling system, including a water pipe absorbing radiant heat in the data center computer room, a water chilling unit forming a third circulation loop with the water pipe, and a cooling tower forming a fourth circulation loop with the water chilling unit. The embodiment has improved the cooling efficiency of the data center computer room.

7 Claims, 5 Drawing Sheets

COOLING SYSTEM OF DATA CENTER COMPUTER ROOM AND DATA CENTER

CROSS-REFERENCE TO RELATED APPLICATIONS

This application claims priority to Chinese Patent Application No. 201711007804.4, filed on Oct. 25, 2017, titled "Cooling System of Data Center Computer Room and Data Center," which is hereby incorporated by reference in its entirety.

TECHNICAL FIELD

The disclosure relates to the field of cooling technology, and in particular to a cooling system of a data center computer room and the data center.

BACKGROUND

With the fast development of communication and network technology, the scale and power density of the data center are increasing, and a large number of data processing devices, networking devices, telecommunication devices, and the like are centralized in the data center computer room. These electronic devices may generate much heat when running, resulting in increasing air temperature in the data center computer room. In order to reduce the heat generated by the devices in the data center computer room, generally it is necessary to arrange a cooling system to cool the air in the data center computer room.

Traditional data centers generally cool the electronic devices in the data center computer room using air conditioners of an air cooling system. Therefore, it is necessary to arrange a plurality of air conditioners in the data center computer room to send cold air removing heat generated by the internal components, such as the central processing unit (CPU), graphics processing unit (GPU), memory, south bridge, north bridge, and motherboard, in the server.

SUMMARY

An object of embodiments of the disclosure includes providing a cooling system of a data center computer room and a data center.

In a first aspect, an embodiment of the disclosure provides a cooling system of a data center computer room. The system includes: a liquid cooling system, including a liquid cooling cabinet, a heat exchanger forming a first circulation loop with the liquid cooling cabinet, and a cooling tower forming a second circulation loop with the heat exchanger; and a radiant cooling system, including a water pipe absorbing radiant heat in the data center computer room, a water chilling unit forming a third circulation loop with the water pipe, and a cooling tower forming a fourth circulation loop with the water chilling unit.

In some embodiments, the liquid cooling system is provided with a circulating water pump to drive a coolant outputted from the liquid cooling cabinet to flow to the heat exchanger; and/or the liquid cooling system is provided with a first cooling water pump to drive a cold fluid outputted from the heat exchanger to flow to the cooling tower.

In some embodiments, the radiant cooling system is provided with a chilled water pump to drive a liquid outputted from the water pipe to flow to the water chilling unit; and/or the radiant cooling system is provided with a second cooling water pump to drive a liquid outputted from the water chilling unit to flow to the cooling tower.

In some embodiments, the liquid cooling system includes a plurality of liquid cooling cabinets; and the liquid cooling system is provided with a coolant distribution unit, where the coolant distribution unit is provided at a liquid inlet of each of the liquid cooling cabinets for distributing the coolant to the liquid cooling cabinets.

In some embodiments, the water pipe is arranged within floor slabs of the data center computer room, to enable the radiant heat in the data center computer room to exchange heat with the water pipe through the floor slabs; and an outer surface of the floor slabs of the data center computer room are covered with a heat insulating layer.

In some embodiments, the heat exchanger includes a plate heat exchanger.

In a second aspect, an embodiment of the disclosure provides a data center, including the cooling system of the data center computer room.

In the cooling system of a data center computer room and a data center according to the embodiments of the disclosure, a liquid cooling system includes a liquid cooling cabinet, a heat exchanger forming a first circulation loop with the liquid cooling cabinet, and a cooling tower forming a second circulation loop with the heat exchanger, the liquid cooling system may discharge heat absorbed by a liquid cooling end of the liquid cooling cabinet using the heat exchanger and the cooling tower, a radiant cooling system includes a water pipe, a water chilling unit forming a third circulation loop with the water pipe, and a cooling tower forming a fourth circulation loop with the water chilling unit, and the radiant cooling system may discharge radiant heat in the data center computer room absorbed by the water pipe using the water chilling unit and the cooling tower to cool the data center computer room, thereby realizing the goal of improving the cooling efficiency of the data center computer room by combining the liquid cooling system and the radiant cooling system.

BRIEF DESCRIPTION OF THE DRAWINGS

By reading and referring to detailed description on the non-limiting embodiments in the following accompanying drawings, other features, objects and advantages of the disclosure will become more apparent.

DETAILED DESCRIPTION OF EMBODIMENTS

The disclosure is further described in detail below in conjunction with the accompanying drawings and embodiments. As will be appreciated, the specific embodiments described here are only used for illustrating the disclosure, rather than limiting the disclosure. Furthermore, it should also be noted that only the parts associated with the disclosure are shown in the accompanying drawings, to facilitate description.

It should be noted that the embodiments and features of the embodiments according to the disclosure may be mutually combined in case of no conflict. The disclosure will be described in detail below by referring to the accompanying drawings and in conjunction with the embodiments.

Figure 1A:
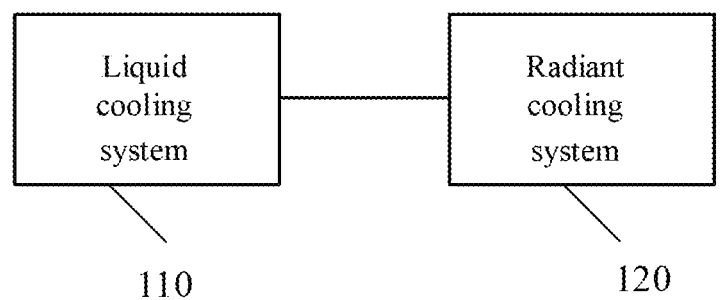
FIG. 1A shows a structural schematic diagram of a cooling system of a data center computer room according to an embodiment of the disclosure.
Figure 1B:
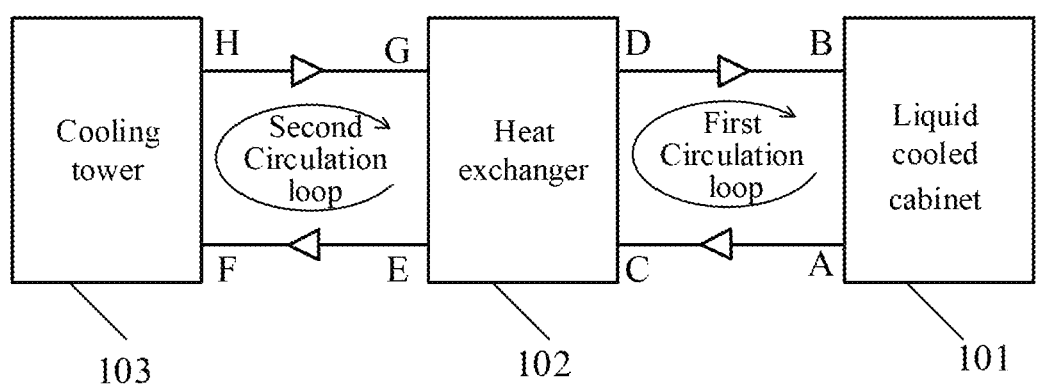
FIG. 1B shows a structural schematic diagram of a liquid cooling system in FIG. 1A.
Figure 1C:
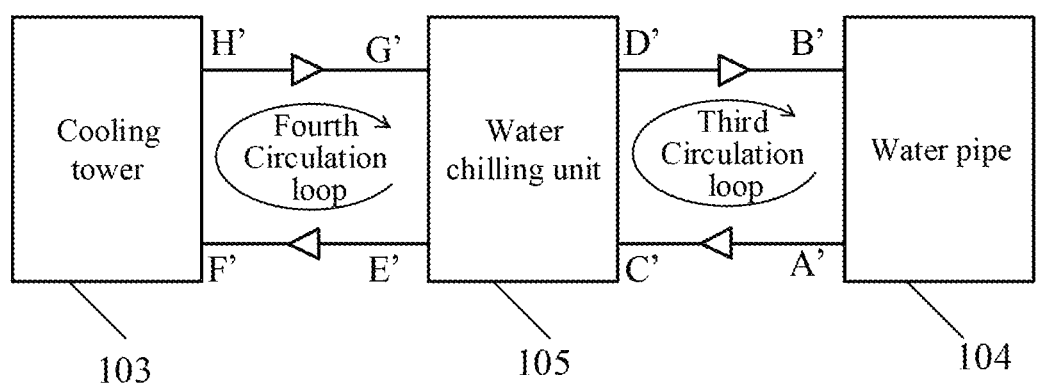
FIG. 1C shows a structural schematic diagram of a radiant cooling system in FIG. 1A.

Reference is made to FIG. 1A, which shows a structural schematic diagram of a cooling system of a data center computer room according to an embodiment of the disclosure. As shown in FIG. 1A, a cooling system 100 of a data center computer room according to the embodiment may include a liquid cooling system 110 and a radiant cooling system 120. The liquid cooling system 110 and the radiant cooling system 120 may be as shown in FIG. 1B and FIG. 1C respectively, FIG. 1B shows a structural schematic diagram of a liquid cooling system in FIG. 1A, and FIG. 1C shows a structural schematic diagram of a radiant cooling system in FIG. 1A. As shown in FIG. 1B, the liquid cooling system 110 may include a liquid cooled cabinet 101, a heat exchanger 102, and a cooling tower 103. As shown in FIG. 1C, the radiant cooling system 120 may include a water pipe 104, a water chilling unit 105 and a cooling tower 103.

In the embodiment, electronic devices, such as a computer and a control panel, in the data center computer room may be arranged in the liquid cooled cabinet 101, to enable a liquid cooling end of the liquid cooled cabinet 101 to absorb heat generated by a CPU, a GPU, and the like in the electronic devices. A coolant in the liquid cooled cabinet 101 may have an increased temperature accordingly after absorbing heat, to generate a high-temperature coolant. The heat exchanger 102 may form a first circulation loop with the liquid cooled cabinet 101, as shown in FIG. 1B. Therefore, the liquid cooled cabinet 101 may output the high-temperature coolant absorbing heat to the heat exchanger 102 via the first circulation loop. The heat exchanger 102 may transfer heat in the high-temperature coolant to a cold fluid side, thereby reducing the temperature of the high-temperature coolant. Moreover, the heat exchanger 102 may further form a second circulation loop with the cooling tower 103, as shown in FIG. 1B. Therefore, the heat exchanger 102 may output a cold fluid absorbing the heat in the high-temperature coolant to the cooling tower 103 via the second circulation loop, to enable the cooling tower 103 to discharge the heat into the atmosphere. It can be seen that the liquid cooling system 110 may discharge heat generated by the CPU, the GPU, and the like of electronic devices in the data center computer room into the outdoor atmosphere via the liquid cooled cabinet 101, the heat exchanger 102 and the cooling tower 103.

Specifically, when the liquid cooling system 110 is running, the liquid cooled cabinet 101 may output the high-temperature coolant absorbing heat from a port A to a port C of the heat exchanger 102, as shown in FIG. 1B. The heat exchanger 102 may transfer the heat in the high-temperature coolant inputted from the port C to the cold fluid side, thereby cooling the high-temperature coolant to generate a low-temperature coolant. The heat exchanger 102 may output the low-temperature coolant to a port B of the liquid cooled cabinet 101 from a port D. The low-temperature coolant may reabsorb the heat generated by the CPU, the GPU, and the like of the electronic devices. The cold fluid in the heat exchanger 102 may have an increased temperature after absorbing the heat in the high-temperature coolant. The cold fluid is outputted to a port F of the cooling tower 103 from a port E. The cooling tower 103 may dissipate heat in the cold fluid having the increased temperature to the outdoor atmosphere, thereby achieving the goal of cooling the electronic devices in the data center computer room. Finally, the cooling tower 103 may output the cooled cold fluid to a port G of the heat exchanger 102 via a port H, to enable the cold fluid to recurrently absorb the heat in the high-temperature coolant inputted from the port C of the heat exchanger 102.

Generally, the data center computer room may be provided with a variety of liquid cooled cabinets, such as a server liquid-cooled cabinet, a network liquid cooled cabinet, and a control panel liquid cooled cabinet. Articles, such as a computer and an associated control device may be stored in the liquid cooled cabinets 101. The liquid cooled cabinets 101 not only play a role in heat dissipation, but also may play a role in protecting the stored devices, shielding electromagnetic interference, and orderly and neatly arranging the devices, to facilitate future maintenance of the devices. Furthermore, the coolant for cooling the CPU and the GPU in the liquid cooled cabinets 101 may be deionized water, ethanol, or the like, thereby avoiding electronic device failure caused by coolant leakage.

In the embodiment, although the liquid cooling system 110 can dissipate the heat generated by the CPU, the GPU, and the like of the electronic devices to the outside of the data center computer room, memories, hard disks, and other components of the electronic devices may also produce heat, and radiate heat into the air in the data center computer room, thereby resulting temperature rise of the data center computer room. The radiant cooling system 120 may dissipate the heat in the air in the data center computer room to the outdoor atmosphere. The water pipe 104 in the radiant cooling system 120 may absorb the radiant heat in the data center computer room, thereby resulting temperature rise of the liquid (e.g., water, or a coolant) in the water pipe 104. The water pipe 104 may form a third circulation loop with the water chilling unit 105. The water pipe 104 may output the liquid having the temperature rise to the water chilling unit 105 via the third circulation loop, thereby enabling the water chilling unit 105 to acquire the heat in the liquid. Furthermore, the water chilling unit 105 may form a fourth circulation loop with the cooling tower 103. The water chilling unit 105 may transfer the acquired heat to the cooling tower 103 via the fourth circulation loop, and the cooling tower 103 may dissipate the heat to the outside of the data center computer room, thereby achieving the goal of reducing the temperature of the air within the data center computer room.

Specifically, when the radiant cooling system 120 is running, the water pipe 104 may output the liquid absorbing the radiant heat in the data center computer room from a port A' to a port C' of the water chilling unit 105, and the water chilling unit 105 may transfer the heat in the liquid inputted from the port C' to a port F' of the cooling tower 103 via a port E', thereby reducing the temperature of the liquid outputted from a port D'. The water chilling unit 105 may output the liquid outputted from the port D' to a port B' of the water pipe 104, to enable the liquid to reabsorb the heat in the data center computer room. The cooling tower 105 may dissipate the heat absorbed by the cooling tower 105 to the atmosphere, thereby achieving the goal of cooling the data center computer room. Finally, the cooling tower 103 may output the cooled liquid to a port G' of the water chilling unit 105 via a port H', to enable the liquid to reabsorb the heat from the water chilling unit 105.

As may be appreciated, the cooling tower 103 in the liquid cooling system 110 and the cooling tower 103 in the radiant cooling system 120 may be a given cooling tower or different cooling towers, which is not limited. The cooling tower may be an open cooling tower. The open cooling tower has advantages such as a simple structure, a low cost, convenient maintenance and repair, and the like.

In the cooling system 100 of the data center computer room according to the above embodiments of the disclosure, a liquid cooling system 110 may include a liquid cooling cabinet 101, a heat exchanger 102 forming a first circulation loop with the liquid cooling cabinet 101, and a cooling tower 103 forming a second circulation loop with the heat exchanger 102, the liquid cooling system 110 may discharge heat of electronic devices absorbed by the liquid cooling cabinet 101 using the heat exchanger 102 and the cooling tower 103, the radiant cooling system 120 may include a water pipe 104, a water chilling unit 105 forming a third circulation loop with the water pipe 104, and a cooling tower 103 forming a fourth circulation loop with the water chilling unit 105, and the radiant cooling system 120 may discharge radiant heat in the data center computer room absorbed by the water pipe 104 using the water chilling unit 105 and the cooling tower 103 to cool the data center computer room, thereby realizing the goal of improving the cooling efficiency of the data center computer room by combining the liquid cooling system 110 and the radiant cooling system 120.

Figure 2A:
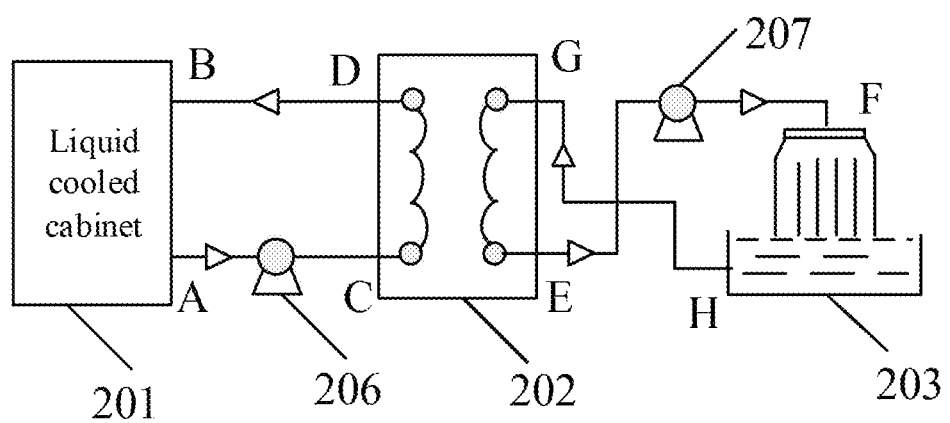
FIG. 2A shows a structural schematic diagram of a liquid cooling system in a cooling system of a data center computer room according to another embodiment of the disclosure.
Figure 2B:
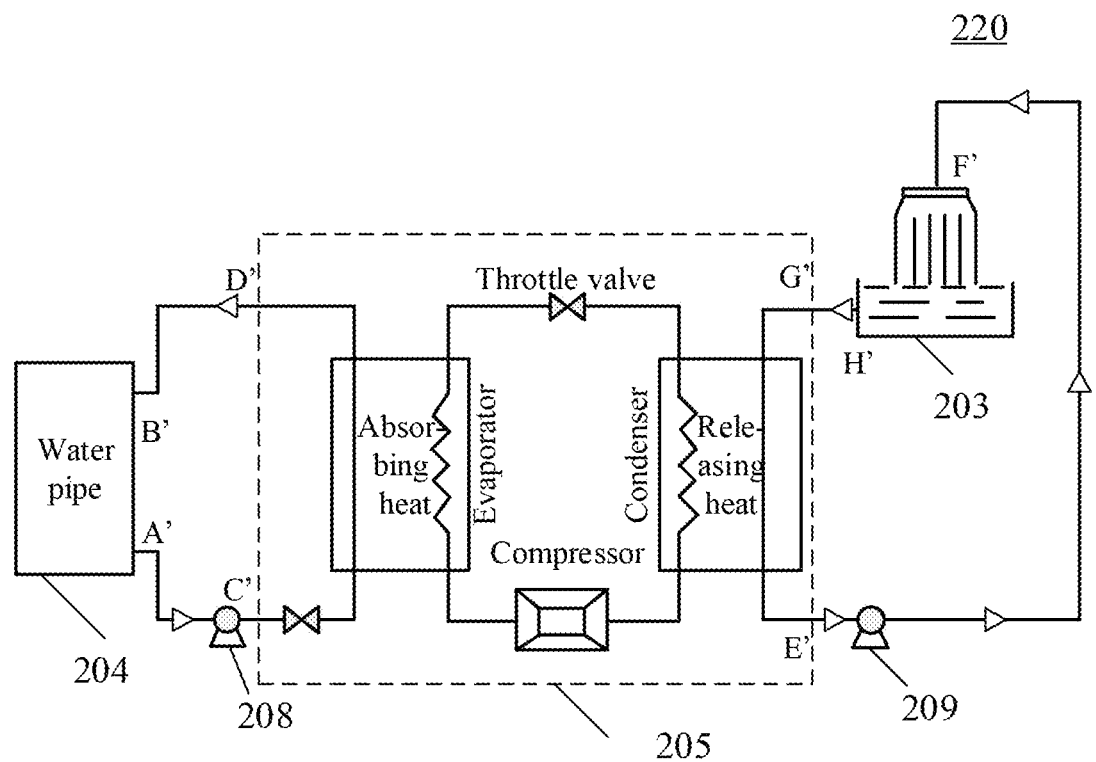
FIG. 2B shows a structural schematic diagram of a radiant cooling system in a cooling system of a data center computer room according to another embodiment of the disclosure.

Further referring to FIG. 2A and FIG. 2B, FIG. 2A shows a structural schematic diagram of a liquid cooling system in a cooling system of a data center computer room according to another embodiment of the disclosure, and FIG. 2B shows a structural schematic diagram of a radiant cooling system in a cooling system of a data center computer room according to another embodiment of the disclosure. As shown in FIG. 2A, a liquid cooling system 210 in a cooling system of a data center computer room according to the embodiment may include a liquid cooled cabinet 201, a heat exchanger 202, a cooling tower 203, a circulating water pump 206, and a first cooling water pump 207. As shown in FIG. 2B, a radiant cooling system 220 in a cooling system of a data center computer room according to the embodiment may include a water pipe 204, a water chilling unit 205, a chilled water pump 208, and a second cooling water pump 209.

In the embodiment, a liquid cooling end of the liquid cooled cabinet 201 of the liquid cooling system 210 may absorb heat generated by a CPU, a GPU, and the like of electronic devices. The liquid cooling cabinet 201 may form a first circulation loop with the heat exchanger 202, a coolant in the liquid cooling cabinet 201 may be outputted to the heat exchanger 202 via the first circulation loop, and the heat exchanger 202 may transfer heat in the coolant to a cold fluid, thereby cooling the coolant. Furthermore, the cooled coolant may be outputted to the liquid cooled cabinet 201 to recool the electronic devices in the liquid cooled cabinet 201. The heat exchanger 202 may form a second circulation loop with the cooling tower 203, the cold fluid in the heat exchanger 202 has an increased temperature after absorbing heat, and is outputted into the cooling tower 203 via the second circulation loop, to enable the cooling tower 203 to dissipate heat to the atmosphere, thereby cooling the cold fluid. Finally, the cooling tower 203 may output the cooled cold fluid into the heat exchanger 202, to enable the cold fluid to continue to absorb the heat in the high-temperature coolant outputted from the liquid cooled cabinet 201.

In the embodiment, the circulating water pump 206 and the first cooling water pump 207 in the liquid cooling system 210 are as shown in FIG. 2A. The circulating water pump 206 may be arranged between the liquid cooled cabinet 201 and the heat exchanger 202. When the pressure of the high-temperature coolant outputted from the liquid cooled cabinet 201 is insufficient, the circulating water pump 206 may provide a force for the high-temperature coolant outputted from the liquid cooled cabinet 201, thus driving the high-temperature coolant outputted from the liquid cooled cabinet 201 to flow to the heat exchanger 202. Specifically, the circulating water pump 206 may drive the high-temperature coolant outputted from a port A of the liquid cooled cabinet 201 to flow to the heat exchanger 202, thereby enabling the high-temperature coolant to be inputted into a port C of the heat exchanger 202.

The heat exchanger 202 may be an indirect heat exchanger. Therefore, in the heat exchanger 202, a circulation portion between port C and port D is not connected with a circulation portion between port E and port G. The liquid flowing between the ports C and D is a coolant inputted from the port C, and the liquid flowing between the ports E and G is a cold fluid for absorbing the heat in the coolant inputted from the port C. The high-temperature coolant flowing between the ports C and D may exchange heat with the cold fluid flowing between the ports E and G, thereby resulting in temperature rise of the cold fluid. The first cooling water pump 207 may be arranged between the heat exchanger 202 and the cooling tower 203. When the pressure of the cold fluid outputted from the heat exchanger 202 is insufficient, the first cooling water pump 207 may drive the cold fluid having the temperature rise to flow to the cooling tower 203. Specifically, the first cooling water pump 207 may drive the cold fluid having the temperature rise outputted from the port E of the heat exchanger 202 to flow to a port F of the cooling tower 203. When the cooling tower 203 is running, the high-temperature cold fluid inputted from the port F may be sprayed onto the surface of a heat dissipation material. An evaporating water vapor is generated due to heat exchange between the high-temperature cold fluid and cold air, thereby enabling the heat in the high-temperature cold fluid to be discharged into the air. The cooled clod fluid falls into a sink, and may then be transferred to the heat exchanger 202 by pumping, to enable the cold fluid to reabsorb heat.

In some optional implementations of the embodiment, the liquid cooling system 210 may include a plurality of liquid cooled cabinets 201, and the liquid cooling system 210 may be further provided with a coolant distribution unit (CDU). The coolant distribution unit may be connected at a liquid inlet of each of the liquid cooled cabinets 201, and may be used for distributing coolant for the liquid cooler cabinets 201. Furthermore, the heat exchanger 202 may be a plate heat exchanger. The plate heat exchanger has advantages such as a high heat transfer coefficient, a compact structure, a small volume, a low price, and the like, and is suitable for being arranged in the liquid cooling system 210.

In the embodiment, the chilled water pump 208 and the second cooling water pump 209 in the radiant cooling system 220 are as shown in FIG. 2B. The chilled water pump 208 may be arranged between the water pipe 204 and the water chilling unit 205. When the pressure of the liquid outputted from the water pipe 204 is insufficient, the chilled water pump 208 may provide a force for the liquid outputted from the water pipe 204, thereby driving the liquid in the water pipe 204 absorbing heat to flow to the water chilling unit 205. Specifically, the chilled water pump 208 may drive the liquid absorbing heat in the water pipe 204 to be outputted to a port C' of the water chilling unit 205 from a port A'. When the water chilling unit 205 is running, a coolant in the evaporator absorbs heat in the liquid inputted from the port C' and is vaporized into a vapor; a compressor continuously extracts the generated vapor from the evaporator, and compresses the vapor; the compressed high-temperature and high-pressure vapor is sent to a condenser, and is condensed into a high-pressure liquid by releasing heat to the liquid flowing between the ports E' and G', the pressure of the high-pressure liquid is reduced by a throttle valve, and the liquid having reduced pressure enters the evaporator, is vaporized again, and absorbs the heat in the liquid inputted from the port C'; and the cycle of above steps is repeated, thereby achieving outputting the heat in the liquid in the water pipe 204 into the cooling tower 203, to enable the cooling tower 203 to release the heat into the atmosphere. It should be noted that, a second cooling water pump 209 is arranged between the cooling tower 203 and the water chilling unit 205, as shown in FIG. 2B. When the pressure of the liquid outputted from a port E' of the water chilling unit 205 is insufficient, the second cooling water pump 209 may provide a force for the liquid outputted from the water chilling unit 205, thereby driving the liquid outputted from the port E' to flow to the cooling tower 203.

Figure 2C:
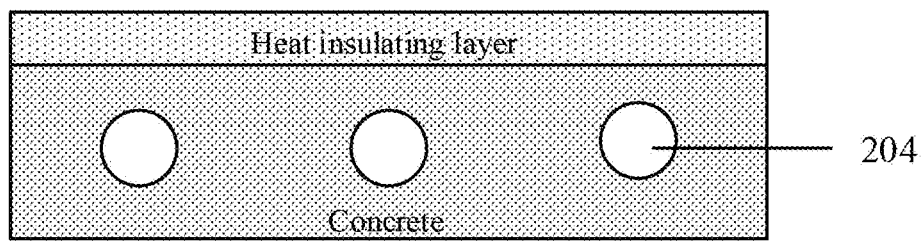
FIG. 2C shows a structural schematic diagram of a water pipe in floor slabs in FIG. 2B.

In some optional implementations of the embodiment, the water pipe 204 may be arranged within floor slabs of the data center computer room, as shown in FIG. 2C, which shows a structural schematic diagram in which the water pipe in FIG. 2B is arranged in the floor slabs. Specifically, the water pipes 204 may be arranged within the concrete of the floor slabs. The liquid flowing in the water pipe 204 is at a low temperature, thereby cooling the floor slabs. Therefore, the floor slabs may absorb the heat in the air of the data center computer room. Furthermore, the heat in the data center computer room may generally be concentrated in floor slabs on the top of data center computer room. The arrangement of the water pipe 204 inside the floor slabs may improve the cooling efficiency of the radiant cooling system 210 on the data center computer room. As shown in FIG. 2C, an insulating layer is further arranged outside the floor slabs provided with the water pipe 204. The insulating layer can avoid reducing the cooling efficiency of the radiant cooling system 220 caused by heat exchange between the floor slabs provided with the water pipe 204 and the outside air. It can be seen that the radiant cooling system 220 may directly discharge the heat in the data center computer room into the outside atmosphere by floor slab radiation, and the cooling system of the data center computer room does not need fans in the process of cooling, thereby reducing power consumption of the cooling system of the data center computer room, and improving the energy utilization.

Furthermore, an embodiment of the disclosure further provides a data center. The data center may include the cooling system of the data center computer room according to the above embodiments. The structure and function of the cooling system of the data center computer room are the same as the above embodiments, and are not repeated any more here.

The above description only provides an explanation of the preferred embodiments of the present disclosure and the technical principles used. It should be appreciated by those skilled in the art that the inventive scope of the present disclosure is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present disclosure are examples.

What is claimed is:

1. A cooling system of a data center computer room, comprising:
    a liquid cooling system, comprising a liquid cooling cabinet, a heat exchanger forming a first circulation loop with the liquid cooling cabinet, and a cooling tower forming a second circulation loop with the heat exchanger; and
    a radiant cooling system, comprising a water pipe absorbing radiant heat in the data center computer room, a water chilling unit forming a third circulation loop with the water pipe, and a cooling tower forming a fourth circulation loop with the water chilling unit, wherein the water pipe is arranged within floor slabs of the data center computer room, to enable a radiant heat in the data center computer room to exchange heat with the water pipe through the floor slabs; and
    an outer surface of the floor slabs of the data center computer room is covered with a heat insulating layer, wherein the water chilling unit comprises an evaporator, a compressor connected to the evaporator and a condenser connected to the compressor and the evaporator.

2. The system according to claim 1, wherein the liquid cooling system is provided with at least one of
    a circulating water pump to drive a coolant outputted from the liquid cooling cabinet to flow to the heat exchanger, or
    a first cooling water pump to drive a cold fluid outputted from the heat exchanger to flow to the cooling tower.

3. The system according to claim 1, wherein the radiant cooling system is provided with at least one of
    a chilled water pump to drive a liquid outputted from the water pipe to flow to the water chilling unit, or
    a second cooling water pump to drive a liquid outputted from the water chilling unit to flow to the cooling tower.

4. The system according to claim 1, wherein the liquid cooling system comprises a plurality of liquid cooling cabinets; and
    the liquid cooling system is provided with a coolant distribution unit, wherein the coolant distribution unit is provided at a liquid inlet of each of the liquid cooling cabinets for distributing the coolant to the liquid cooling cabinets.

5. The system according to claim 1, wherein the heat exchanger comprises a plate heat exchanger.

6. A data center, comprising a cooling system of a data center computer room, the cooling system comprising:
    a liquid cooling system, comprising a liquid cooling cabinet, a heat exchanger forming a first circulation loop with the liquid cooling cabinet, and a cooling tower forming a second circulation loop with the heat exchanger; and
    a radiant cooling system, comprising a water pipe absorbing radiant heat in the data center computer room, a water chilling unit forming a third circulation loop with the water pipe, and a cooling tower forming a fourth circulation loop with the water chilling unit, wherein the water pipe is arranged within floor slabs of the data center computer room, to enable a radiant heat in the data center computer room to exchange heat with the water pipe through the floor slabs; and an outer surface of the floor slabs of the data center computer room is covered with a heat insulating layer, wherein the water chilling unit comprises an evaporator, a compressor connected to the evaporator and a condenser connected to the compressor and the evaporator.

7. The system according to claim 1, wherein the water pipe is connected to the evaporator, and the condenser is connected to the cooling tower.

\* \* \* \* \*